United States Patent [19]
Falcone et al.

[11] Patent Number: 5,660,319
[45] Date of Patent: Aug. 26, 1997

[54] ULTRASONIC BONDING PROCESS

[75] Inventors: Robert J. Falcone, Odessa; Timothy J. Hogan, Allen, both of Tex.

[73] Assignee: Texas Instruments Incorporated, Dallas, Tex.

[21] Appl. No.: 373,161

[22] Filed: Jan. 17, 1995

[51] Int. Cl.$^6$ .................................................. H01L 21/607
[52] U.S. Cl. ........................... 228/110.1; 228/1.1
[58] Field of Search .............................. 228/110.1, 180.5, 228/1.1, 4.5

[56] References Cited

U.S. PATENT DOCUMENTS

| | | | |
|---|---|---|---|
| 5,186,378 | 2/1993 | Alfaro | 228/110.1 |
| 5,201,454 | 4/1993 | Alfaro et al. | 228/110 |
| 5,244,140 | 9/1993 | Ramsey et al. | 228/110.1 |

FOREIGN PATENT DOCUMENTS

| | | | |
|---|---|---|---|
| 285799 | 3/1972 | U.S.S.R. | 228/1.1 |
| 743815 | 6/1980 | U.S.S.R. | 228/110.1 |
| 1031694 | 7/1983 | U.S.S.R. | 228/110.1 |

OTHER PUBLICATIONS

Japan Inst. Metals, vol. 57, No. 8 (1993) pp. 884–889—Effect of Ultasonic Vibration on Wire Bonding, Hiroshi Haji et al.

ICEMM Proceedings 1993, pp. 336–377, High Reliability Bonding Technology by the 120KHz Frequency of Ultrasonic, Yuji shirai et al.

Autom. Weld, "Ultrasonic Microwelding at a Frequency of 245kHz", E.G. Konovalov and V.S. Galkov, vol. 23, No. 6, pp. 64, 65, Jun. 1970.

Primary Examiner—Samuel M. Heinrich
Attorney, Agent, or Firm—W. James Brady, III; Richard L. Donaldson

[57] ABSTRACT

A method for bonding a metal wire (17) to a metal bond site (16) utilizes an ultrasonic power source (12) that is at approximately 162 KHz. A mash force is applied from a pressure source (13) during bonding. A metal exchange takes place between the metal wire (17) and the bond site (16) during the application of the ultrasonic power to produce a strong bond between the metal wire (17) and the bond site (16).

19 Claims, 11 Drawing Sheets

| TEST 1 - POWER SWEEP  TIME=8ms, MASH FORCE=19 GRAMS-STATIC |||||
|---|---|---|---|---|
| POWER | PULL FORCE | FAIL MODE | AVG | STD |
| .0.02 | 7.5 | 1 | | |
| | 4.5 | 1 | | |
| | 2.5 | 1 | 4.833333 | 2.515511 |
| 0.05 | 2 | 1 | | |
| | 1.5 | 1 | | |
| | 6.5 | 1 | 3.333333 | 2.753785 |
| 0.08 | 9.0 | 1 | | |
| | 12.0 | 2 | | |
| | 6.3 | 1 | 9.15 | 2.330236 |
| 0.10 | 7.8 | 1 | | |
| | 11.5 | 2 | | |
| | 7.8 | 1 | | |
| | 11.3 | 2 | 9.6 | 2.080064 |
| 0.12 | 8.8 | 1 | | |
| | 7.3 | 1 | | |
| | 9.5 | 2 | | |
| | 9.8 | 2 | 8.85 | 1.115949 |
| 0.15 | 10.5 | 1 | | |
| | 9.5 | 2 | | |
| | 10.5 | 2 | | |
| | 10.3 | 1 | 10.2 | 0.476095 |

FIGURE 18

| TEST 2 - TIME SWEEP POWER=0.15 WATTS, MASH FORCE=19 GRAMS-STATIC ||||||
|---|---|---|---|---|
| TIME (ms) | PULL FORCE | FAIL MODE | AVE | STD |
| 0.5 | 11.3 | 2 | | |
| | 11.0 | 1 | | |
| | 3.8 | 1 | | |
| | 11.0 | 1 | 9.275 | 3.652739 |
| 2.0 | 8.8 | 1 | | |
| | 11.5 | 1 | | |
| | 11.0 | 2 | | |
| | 6.8 | 1 | 9.525 | 2.162368 |
| 4.0 | 11.5 | 2 | | |
| | 11.0 | 2 | | |
| | 8.0 | 2 | | |
| | 10.0 | 2 | 10.125 | 1.547848 |
| 6.0 | 9.8 | 2 | | |
| | 10.3 | 2 | | |
| | 8.8 | 2 | | |
| | 9.3 | 2 | 9.55 | 0.645497 |
| 8 | 9.8 | 2 | | |
| | 9.8 | 2 | | |
| | 10.0 | 2 | | |
| | 11.0 | 2 | 10.15 | 0.574456 |

FIGURE 19

| DIE BOND WIDTH | | | |
|---|---|---|---|
| UNIT 1 | UNIT 2 | UNIT 3 | UNIT 4 |
| 2.2 | 2.2 | 2.3 | 2.2 |
| 2.3 | 2.2 | 2.3 | 2.2 |
| 2.2 | 2.3 | 2.3 | 2.1 |
| 2.3 | 2.2 | 2.2 | 2.2 |
| 2.4 | 2.2 | 2.2 | 2.2 |
| 2.3 | 2.3 | 2.2 | 2.1 |
| AVERAGE - 2.233333 : STANDARD 0.68718 | | | |

FIGURE 20

ULTRASONIC BONDING PROCESS

FIELD OF THE INVENTION

This invention relates to bonded connections on semiconductor devices such as integrated circuits, and more particularly to aluminum to aluminum interconnections utilizing high frequency ultrasonic energy.

CROSS-REFERENCED PATENTS

The following U.S. Patents are assigned to the assignee of the present application:

U.S. Pat. No. 5,201,454, issued Apr. 13, 1993, and entitled PROCESSOR ENHANCED INTERMETALLIC GROWTH IN IC INTERCONNECTIONS; AND U.S. Pat. No. 5,244,140, issued Sep. 14, 1993, and entitled ULTRASONIC BONDING PROCESS BEYOND 125 KHZ.

BACKGROUND OF THE INVENTION

Ultrasonic bonding has been accomplished at various frequency up to about 125 KHz. These bonds have principally been made between gold bond wires and aluminum or aluminum alloy surfaces on integrated circuits. Interconnections have been made between aluminum wires and aluminum surfaces, but these interconnections have been made at a frequency of about 60 KHZ. Such interconnections are described in the paper entitled EFFECT OF ULTRASONIC VIBRATION ON WIRE BONDING, by Hiroshi Haji, Toshiaki Morita, Hideharu Nakashima and Hideo Yoshinaga, Department of Materials Science and Technology, graduate School of Engineering Sciences, Kyushu University, Kasuga, Fukuoka, Japan. The aluminum to aluminum interconnections made at this lower frequency has not produced a sufficient metal interchange between the bond wire and the bond surface to produce a strong bond. Hence a process is needed to achieve, through metal interchange, a strong bond wire to bond surface connection at lower temperatures and shorter bonding times.

Bonds have been made at 120 KHz as described in an article in the ICEMM Proceedings of 1993, HIGH RELIABILITY WIRE BONDING TECHNOLOGY BY THE 120 KHZ FREQUENCY OF ULTRASONIC, by Yuji Shirai, Kanji Otsuka, Takashi Araki, Isao Seki, Kouiti Kikuchi, Nobuhire Fujita, and Takashi Miwa. This article shows a reduced wire bond failure rate at 120 KHz, and discusses gold wedge bonding at room temperature.

SUMMARY OF THE INVENTION

The invention is to a method of forming a bond structure between a conductive metal bond site and a conductive metal wire having a bond end. The bond is formed by contacting the bond end of the wire to the bond site such that the bond end and the bond site present an interface therebetween. Ultrasonic energy is applied at the interface at a frequency of approximately between 150 and 165 KHz to form an electrical bond between the bond site and wire bond end.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 18 is a table showing the data for FIGS. 14–15;

FIG. 19 is a table showing the data for FIGS. 16–17; and

FIG. 20 is a table of deform widths of bonded wires on the bond site.

DESCRIPTION OF A PREFERRED EMBODIMENT

Figure 1:
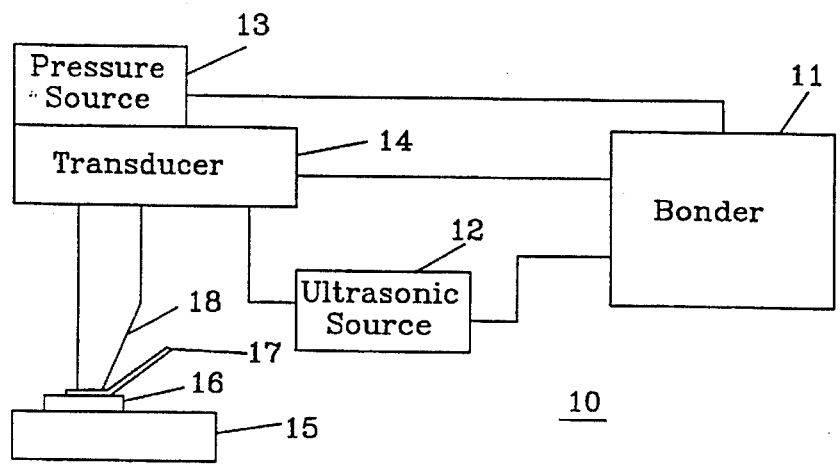
FIG. 1 shows a basic ultrasonic bonding apparatus.

FIG. 1 pictorially shows an ultrasonic wedge bonder apparatus 10 used in the present invention. Bonder apparatus 10 is similar to that used in the prior art with the exception that the ultrasonic power source is operating at a frequency in the region of 162 KHZ, which is considerable higher than prior art ultrasonic bonders. Bonder apparatus 10 includes bonder (and control) 11 which is connected to and controls the ultrasonic power source 12 and a pressure source 13. Ultrasonic power source 12 is connected to transponder 14 which is connected to the wedge bond tool 18. The Ultrasonic power applied to wedge bond tool 18 imparts the ultrasonic power to the bonding interface, such as the interface between bond wire 17 and bond pad 16 on integrated circuit 15.

Figure 2:
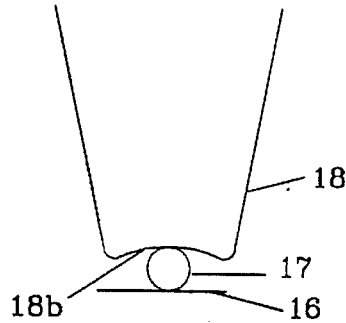
FIG. 2 shows a bonding wedge and wire before bonding.
Figure 3:
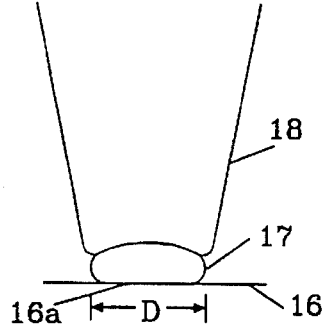
FIG. 3 shows the bonding wedge and wire after welding.

FIG. 2 shows wedge bond tool 18 adjacent to wire 16 which is to be bonded to bond pad 16. Pressure and ultrasonic power is applied to bond wire 17 by wedge bond tool 18. As pressure is applied, bond wire 17 is flattened as shown in FIG. 3 presenting an interface 16a between flattened bond wire 17 and bond pad 17. Wire 17 before it is flattened is, for example, about 1.25 mils diameter. After bonding and flattening under pressure, the contact surface 16a between flattened bond wire 17 and bond pad has a dimension D of approximate 1.5 to 2.5 mils.

Figure 3A:
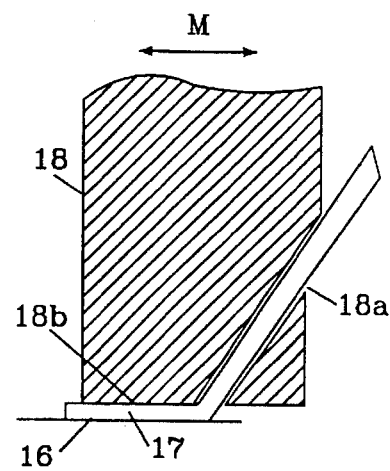
FIG. 3a is a side view, in section, of the bond wedge tool and the bond wire.

FIG. 3a is a partial side view in section of wedge bond tool 18 showing wire 17 extending through bond wire hole 18a. As wire 17 is bonded to bond pad 16, end 18b of tool 18 presses downward and applies ultrasonic energy in the direction indicated by the two ended arrow M. The application of the ultrasonic energy and the downward pressure cause wire 17 to flatten and the interface between bond pad 16 and bond wire to experience a metal interchange between wire 17 and bond pad 16. This metal interchange creates a bond between wire 17 and bond pad 16. The downward pressure of tool 17, the ultrasonic power applied to tool 17, and the time the downward pressure and ultrasonic power is applied determines the amount of metal interchange and, the strength of the bond between wire 17 and bond pad 16.

Figure 4:
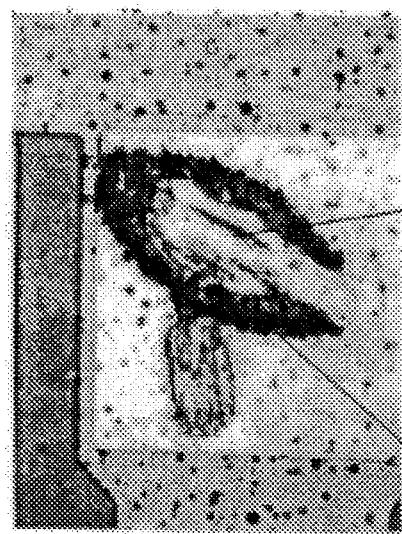
FIGS. 4, 5 and 6 show prior art bonding areas on an integrated circuit.
Figure 5:
Figure 6:
Figure 7:
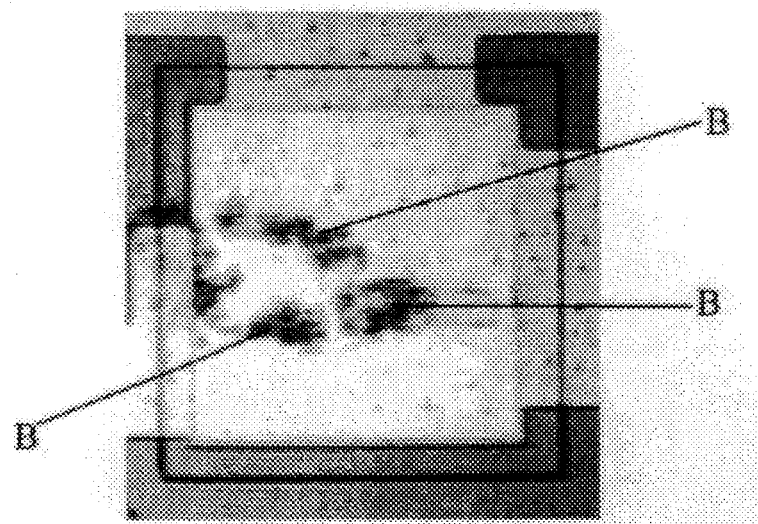
FIGS. 7, 8, 9, 10 and 11 show bonding areas of the present invention where bonding was done at various power levels.
Figure 8:
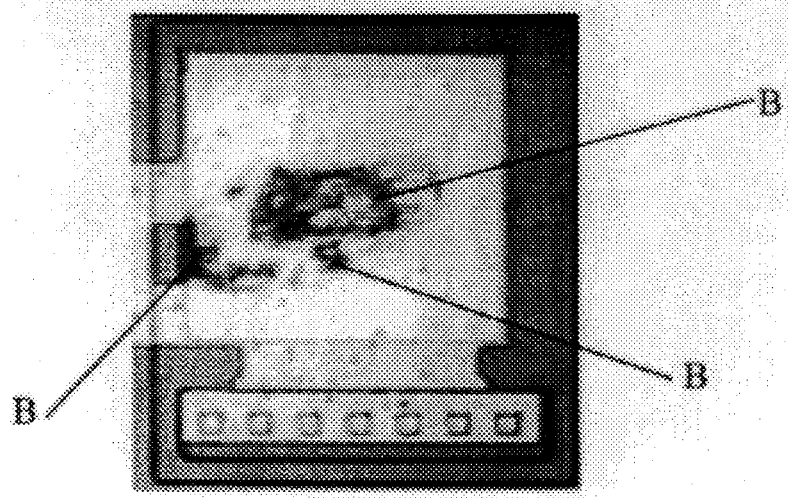
Figure 9:
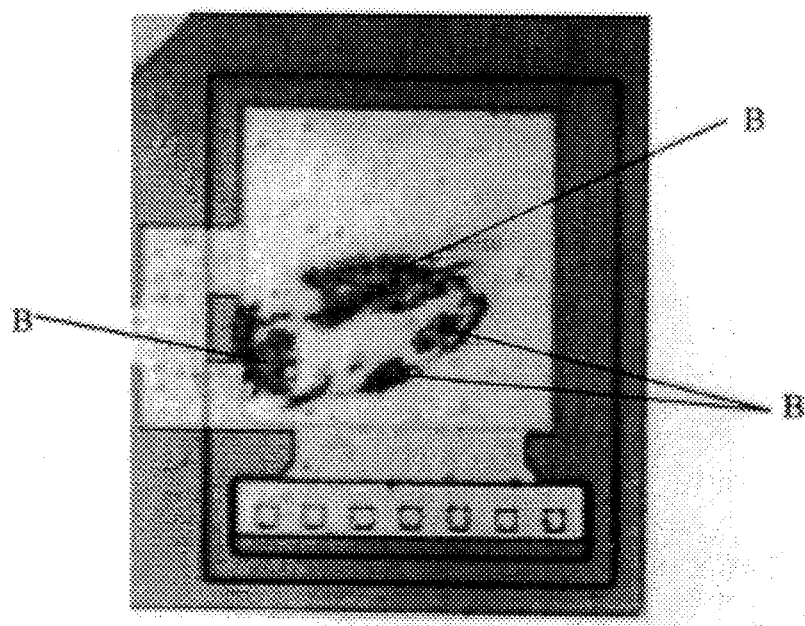
Figure 10:
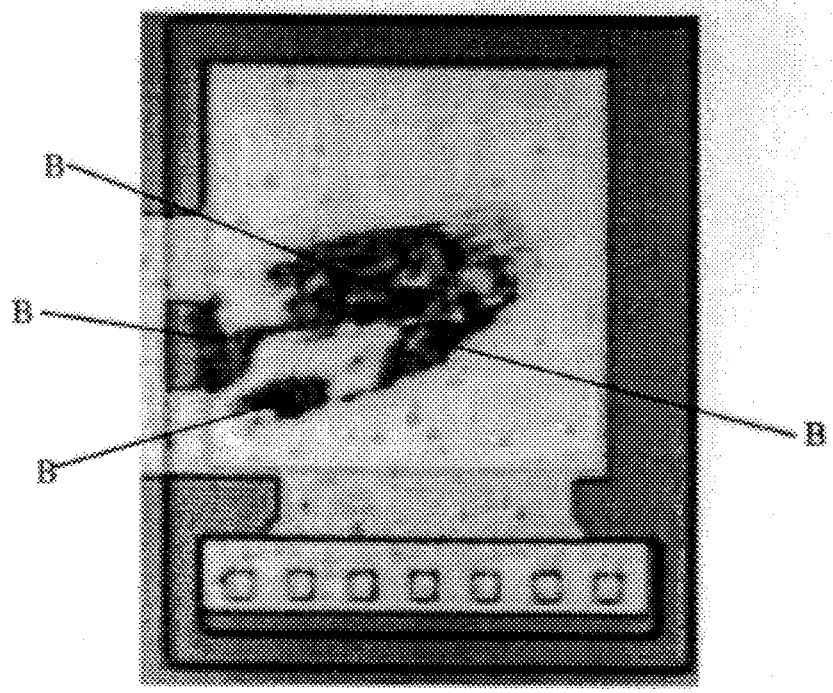
Figure 11:
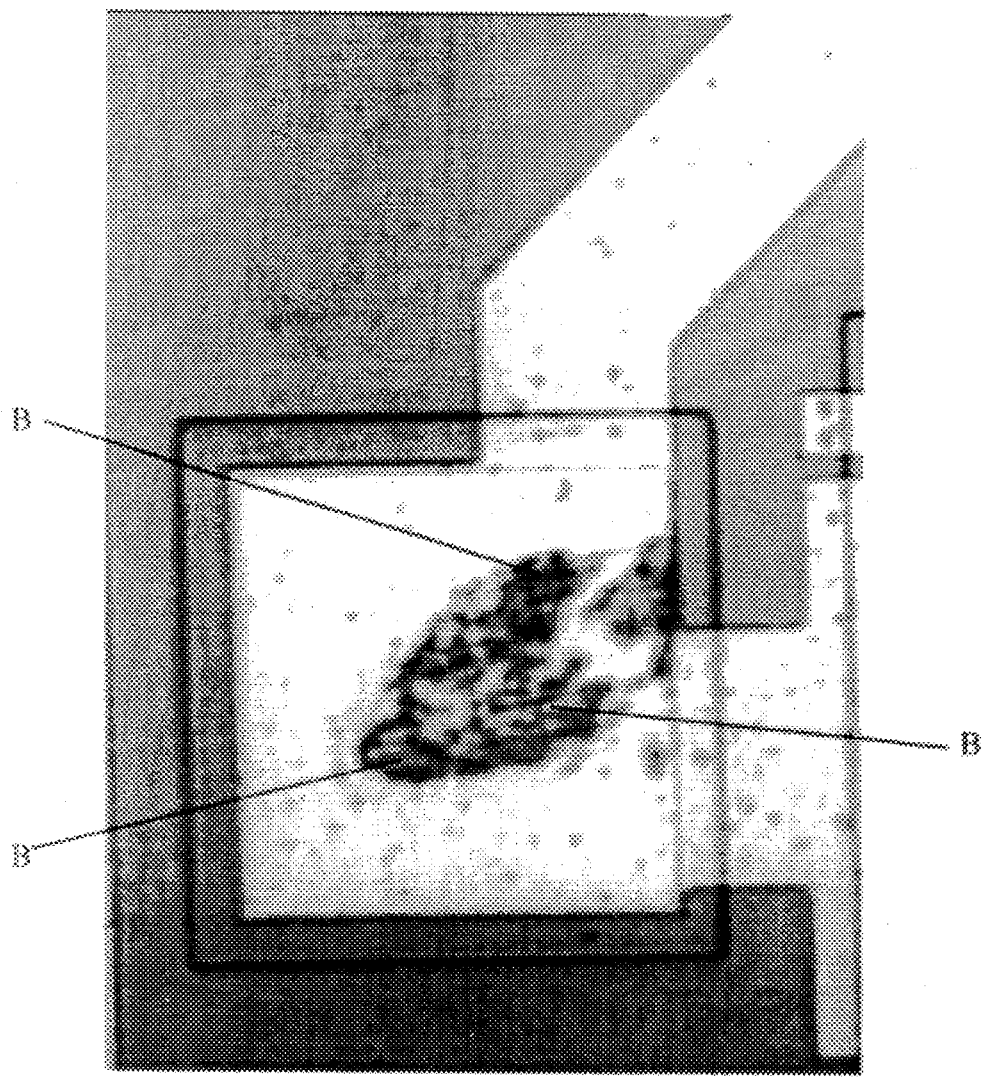

To evaluate bonding an aluminum wire to an aluminum bond pad on an integrated circuit, test were first made using an ultrasonic power source at 60 KHz. FIGS. 4, 5 and 6 show bond areas on a bond pad after the bond wire has been lifted from the bond pad. For the 60 KHz bonds, the downward pressure (static load) was set at 18 grams, the time of bond was about 21 ms and the ultrasonic frequency was at 60 KHz. It should be noted that bonding was principally at the outer periphery of the bond with the center of the bond area being incomplete, i.e. no or little metal interchange, thus no bond. The bond areas generally denoted at B (bond) are donut shaped with the center unbonded area denoted V (void). These examples, FIGS. 4–6, show incomplete bonding.

FIGS. 7–11 show bonds made at 162 KHz, with a mash force of 19 grams (static load), a bond time at 8 ms, and the ultrasonic power as varied. The bond of FIG. 7 was made with an ultrasonic power of 0.02 watt, The bonds of FIGS. 8, 9, 10 and 11 were made with ultrasonic bond powers of 0.05, 0.08, 0.10 and 0.12 watt respectively. The data of these tests and further test are discussed below and are detailed in FIGS. 18 and 19. Basically, the five tests at fixed times and mash force show that the ultrasonic power level increases the bond strength as indicated in the pull force required to removed a bonded wire from the bond pad after bonding. The metal interchange increases with the increase in power. The dark areas in FIGS. 7–11 are the bond or metal interchange area. The bond areas are generally labeled B. Pull tests were conducted for each power setting, and the pull force average increased from the 4 gram range up to the 9–10 gram range after the power exceeded 0.05 watts. The pull force fail modes changed from lifted die bonds (indicated as 1) to die bond neck failures (indicated as 2). This neck failure normal drives the least amount of variation with the lifted bond driving the highest variability. (See FIGS. 18 and 19) In contrast to the interconnect created at 60 KHz, the interconnect created at 162 KHZ initiates more metal interchange from the center and grows across the entire area beneath the bond at correct parameter settings.

Figure 12:
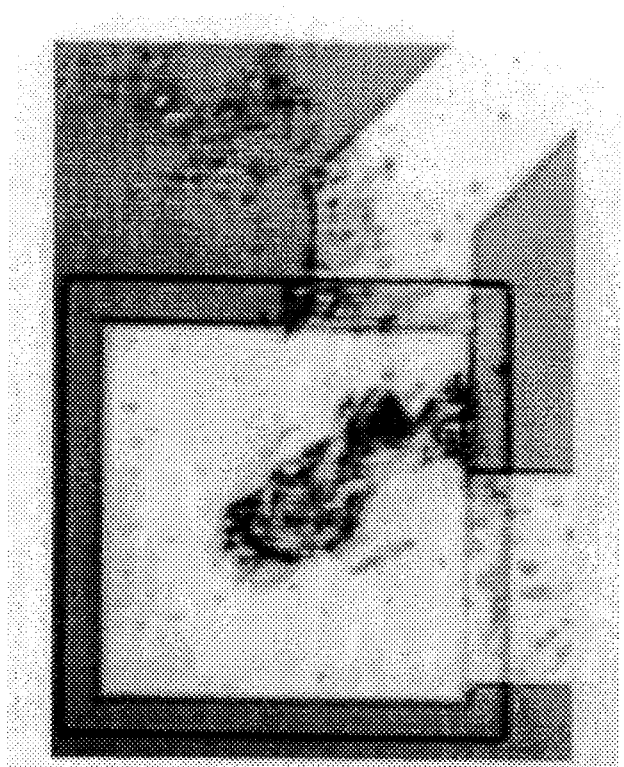
FIGS. 12 and 13 show bonding areas done at a fixed power level and different bonding times.
Figure 13:
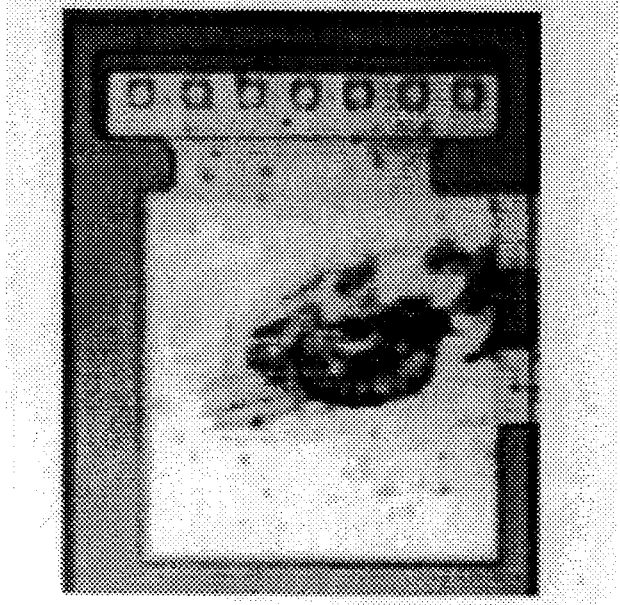
Figure 14:
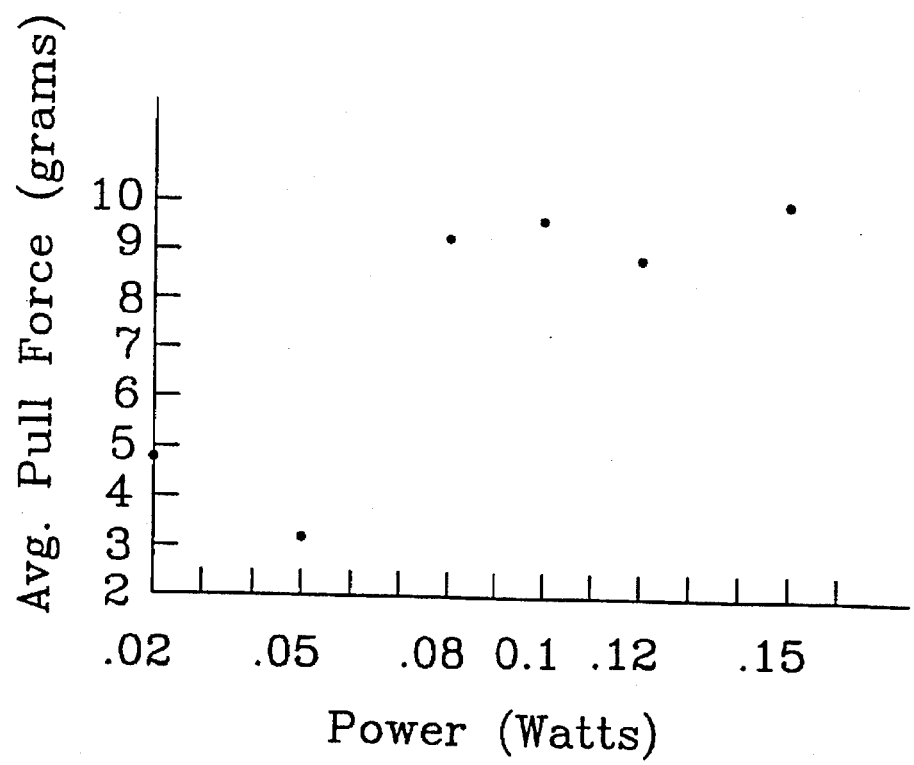
FIG. 14 shows average pull force to remove a bonded lead from a bond surface at different power levels.
Figure 15:
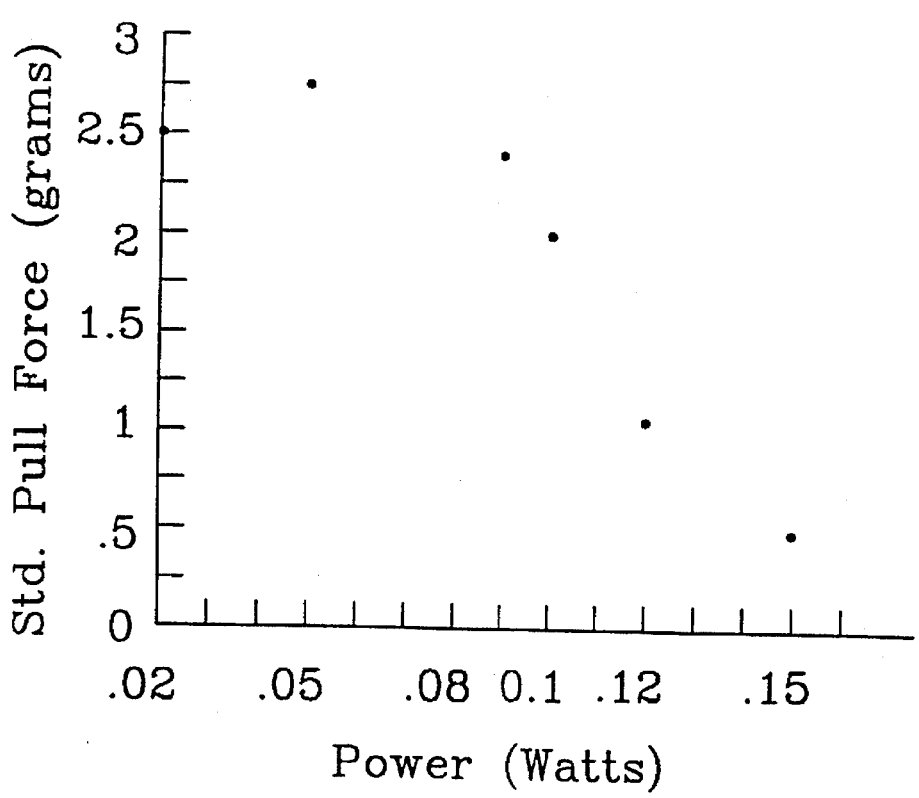
FIG. 15 shows standard bond pull force at different power levels.
Figure 16:
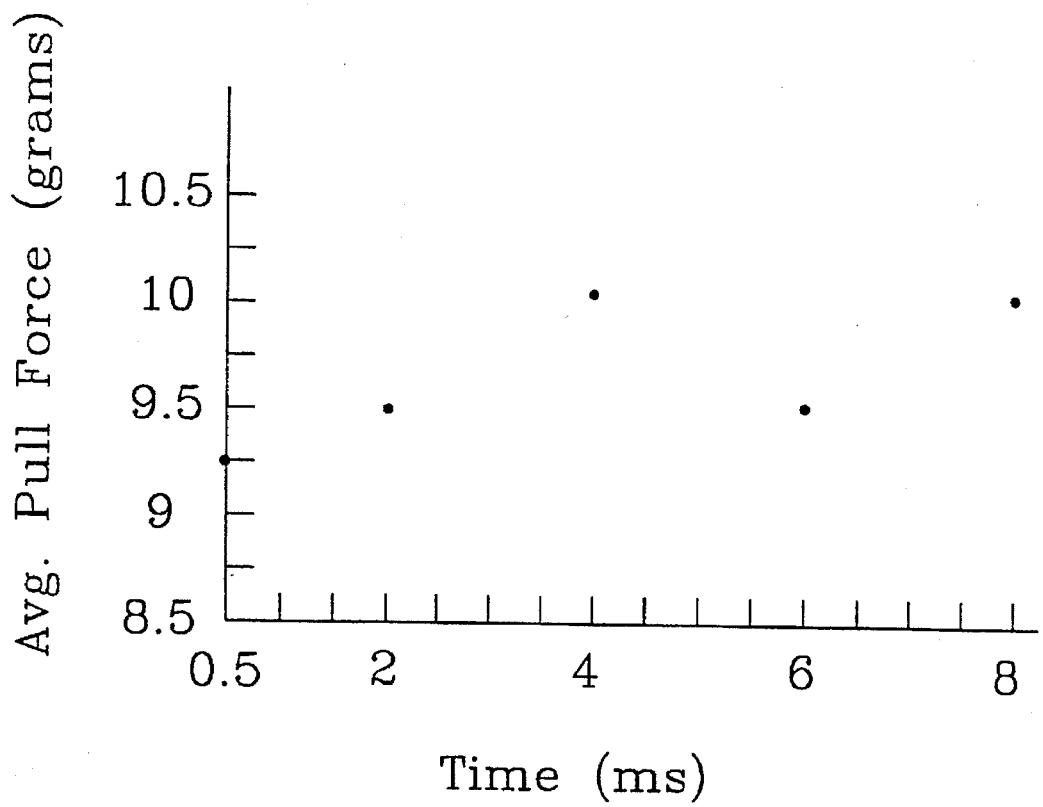
FIG. 16 shows average bond pull force at for various bond times.
Figure 17:
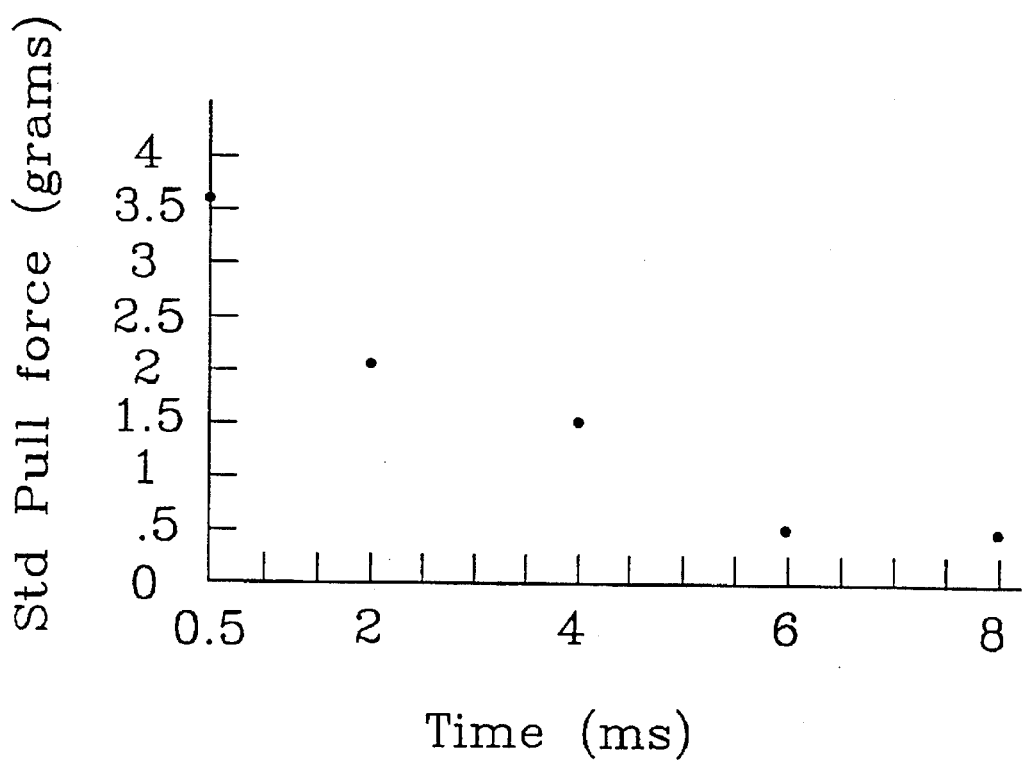
FIG. 17 shows standard bond pull force for various bond times.

FIGS. 12 and 13 show bonds made at 162 KHz, a fixed power of 0.15 watt and at bond times of 2 ms and 5 ms, respectively. The mash force pressure was set at 19 grams (static load). The test data (FIG. 19) shows that the effect of time being increased did not make as large of a change in average pull strength, but did reduce the standard deviation equivalent to the power increase. This test, time sweep, showed that once the time was increased above 4 ms, the bond failure modes all changed to breaks at the die bond neck. Time settings above 2 ms did not allow bonds to be removed to view the interconnect areas. The time used in this testing indicates that time above 5 ms does not increase bond adhesion significantly relative to Z force and power used. Standard 60 KHz bonding typically requires time setting of 20–30 ms to derive adhesion characteristics desired.

FIGS. 18 and 19 show a tabulation of the various tests illustrated in FIGS. 7–13, and the data for tables of FIGS. 14–17. Test 1 utilizes a power sweep of 0.02 watt to 0.15 watt. The force in grams to cause failure of the bond connection is shown. A "1" in the failure mode indicates that the bond wire peeled up from the bond surface, and a "2" indicates that the bond wire broke at the neck adjacent to the bond surface. Test 2 uses a time sweep testing with bonding times from 0.5 ms to 8 ms.

Based upon the above testing, a number of sample parts were processed at a time of 6 ms, a power of 0.15 watts and a mash force of 21 grams, a pull test showed a pull force average of 8 grams with a standard deviation of 0.7 grams. With this test all pull strength fail modes were die bond neck failures. Die bond deform width was measured for this test and the results are shown in FIG. 20. Each integrated circuit has six wire bonds, and the deform width of each bond is shown. There were four IC's with six bonds each. The average bond deform width (D in FIG. 3) for the 24 bonds was 2.3333 mils. The standard deviation was 0.068718 mil. Based upon the above data it is seen that bonds made at a ultrasonic frequency of 162 KHZ provides a stronger bond with a greater metal interchange across the bond area.

What is claimed:

1. A method of forming an bond structure, comprising the steps of:
    providing a conductive metal bond site;
    providing a conductive metal wire having a bond end;
    contacting the bond end of the wire to the bond site such that the bond end and the bond site present an interface therebetween; and
    applying ultrasonic energy at the interface at a frequency of approximately 162 KHz to form an electrical bond between the bond site and wire bond end.

2. The method according to claim 1, wherein the bond site and conductive metal wire are of aluminum.

3. The method according to claim 1, wherein a metallic interchange occurs at the interface during the time the ultrasonic energy is applied at the interface.

4. The method according to claim 1, including the step of applying a mash force to the metal wire on the bond site during the time the ultrasonic energy is applied at the interface.

5. The method according to claim 1, wherein the ultrasonic energy is applied for a time ranging from 0.5 ms to 8 ms.

6. The method according to claim 1, wherein the applied ultrasonic energy is in an amount from approximately 0.15 watt to 0.5 watt.

7. The method according to claim 1, wherein the process is accomplished at substantially ambient temperature.

8. A method of forming a metallic bond structure, comprising the steps of:
    providing a conductive metal bond site;
    providing a conductive metal wire having a bond end;
    contacting the bond end of the wire to the bond site such that the bond end and the bond site present an interface therebetween;
    applying ultrasonic energy at the interface at a frequency of approximately 162 KHz to form an electrical bond between the bond site and wire bond end; and
    applying a mash force to the metal wire on the bond site during the time the ultrasonic energy is applied at the interface.

9. The method according to claim 8, wherein the bond site and conductive metal wire are primarily of aluminum.

10. The method according to claim 8, wherein a metal interchange occurs at the interface during the time the ultrasonic energy is applied at the interface.

11. The method according to claim 8, wherein the ultrasonic energy is applied for a time ranging from 0.5 ms to 8 ms.

12. The method according to claim 8, wherein the applied ultrasonic energy is in an amount from approximately 0.15 watt to 0.5 watt.

13. The method according to claim 8, wherein the process is accomplished at substantially ambient temperature.

14. A method of forming an aluminum bond structure, comprising the steps of:
    providing a conductive aluminum bond site;
    providing a conductive aluminum wire having a bond end;
    contacting the bond end of the wire to the bond site such that the bond end and the bond site present an interface therebetween; and
    applying ultrasonic energy at the interface at a frequency between 150 and 165 KHz to form an electrical bond between the bond site and wire bond end.

15. The method according to claim 14, wherein a metal interchange occurs at the interface during the time the ultrasonic energy is applied at the interface.

16. The method according to claim 14, including the step of applying a mash force to the metal wire on the bond site during the time the ultrasonic energy is applied at the interface.

17. The method according to claim 14, wherein the ultrasonic energy is applied for a time ranging from 0.5 ms to 8 ms.

18. The method according to claim 14, wherein the applied ultrasonic energy is in an amount from approximately 0.15 watt to 0.5 watt.

19. The method according to claim 14, wherein the process is accomplished at substantially ambient temperature.

* * * * *